(12) United States Patent
Madhu et al.

(10) Patent No.: US 6,211,710 B1
(45) Date of Patent: Apr. 3, 2001

(54) CIRCUIT FOR GENERATING A POWER-UP CONFIGURATION PULSE

(75) Inventors: R. Madhu, Bangalore; U. Bharath, Nellore, both of (IN)

(73) Assignee: Texas Instruments India Limited, Bangalore (IN)

( * ) Notice: Subject to any disclaimer, the term of this patent is extended or adjusted under 35 U.S.C. 154(b) by 0 days.

(21) Appl. No.: 09/223,642

(22) Filed: Dec. 30, 1998

(51) Int. Cl.⁷ .................................................. H03K 3/02
(52) U.S. Cl. ................................. 327/198; 327/143
(58) Field of Search ............................. 327/142, 143, 327/198, 576

(56) References Cited

U.S. PATENT DOCUMENTS

| | | | |
|---|---|---|---|
| 4,888,498 | * 12/1989 | Kadakia | 327/546 |
| 5,408,435 | * 4/1995 | McClure et al. | 365/201 |
| 5,691,659 | * 11/1997 | Riley | 327/143 |
| 5,703,512 | * 12/1997 | McClure | 327/198 |

FOREIGN PATENT DOCUMENTS 5-291915A * 5/1993 (JP) ...................................... 327/143

* cited by examiner

*Primary Examiner*—Timothy P. Callahan
*Assistant Examiner*—Hai L. Nguyen
(74) *Attorney, Agent, or Firm*—Alan K. Stewart; Wade James Brady, III; Frederick J. Telecky, Jr.

(57) ABSTRACT

A circuit for ensuring stabilized configuration information upon power-up is disclosed. In one embodiment, a semiconductor device includes a configuration information stored in a number of nonvolatile storage elements (fuse bits (16)). A configuration power-on reset circuit (10) generates a signal for latching the configuration data into volatile configuration registers (18) on power-up. The configuration data signals are generated in response to a power-on reset (POR) pulse, and not latched until a predetermined delay after the POR pulse is terminated. The predetermined delay allows time for the data signals from the fuse bits (16) to "settle." Subsequent POR pulses will not result in another latching action.

8 Claims, 3 Drawing Sheets

CIRCUIT FOR GENERATING A POWER-UP CONFIGURATION PULSE

TECHNICAL FIELD

The present invention relates generally to semiconductor devices and more particularly to circuits for generating signals in response to the initial power-up state of such devices.

BACKGROUND OF THE INVENTION

The initial application of a power supply voltage to a semiconductor device is often referred to as "power-up." During power-up at least one supply voltage rapidly rises (ramps-up) to a full scale power supply voltage. For example, in the case of complementary metal oxide semiconductor (CMOS) logic circuits, a positive power supply voltage (Vcc) ramps up from a low voltage of around zero volts, while a second power supply voltage (Vss) is maintained at zero volts. Once the device is powered-up (i.e., Vcc has reached full scale) it will normally operate as designed. The initial power-up of a semiconductor device can result in some uncertainty in the device operation, however. As just one example, in logic circuits employing MOS devices, as the power supply ramps up, some MOS devices may suffer from sub-threshold leakage, pulling nodes to intermediate voltage levels. These nodes can be driven to unintended full logic levels once the power supply has reached its maximum value. As a result, the potential at various nodes within the device may not be predictable following power-up. Consequently, the device may not operate as designed.

To eliminate uncertainty in the configuration of a semiconductor device following power-up, power-on reset circuits are often used. Such circuits are enabled upon power-up, and guarantee that all circuits within the device are properly configured. As just one example, a power-on reset circuit can generate a power-on reset pulse in response to the initial application of the positive supply voltage. The power-on reset pulse propagates through the device, driving the nodes to predetermined logic levels. Once all the nodes are set, the device will operate as designed.

While it is desirable to have predictable circuit operation on power-up, it is also desirable to provide configurability to a semiconductor device. Configurability enables the operation, architecture or other aspects of a semiconductor device to be altered so that the device is adaptable to a wider range of applications and implementations. As just one example, in the case of nonvolatile memory devices, it is desirable to enable such devices to have configurable architectures in which blocks of the memory can be designated as "boot" blocks, and only be altered under special conditions. Further, different nonvolatile memory architectures may be configured for different programming and/or erase algorithms. Such configuration information may also include redundancy information which can designate how defective memory cells may be replaced by redundant memory cells. It is important that once a semiconductor device has been configured, that the configuration information will not be lost, even in the event the power supply voltages supplied to the device are turned off.

A similar concern is raised by devices having power saving modes in which the power supply is disconnected from portions of the device, or the portions of the device are "powered-down" (e.g., for CMOS devices, all nodes brought down to zero volts). When such devices are "woken" up (i.e., power is returned to the circuits) the circuits must be reset. It desirable that such a wake-up operation should not effect the configuration information initially established upon power-up.

User configuration information can be stored in a semiconductor device in a variety of ways. A few examples include "hard wiring" the device in a certain configuration. Hardwiring can include utilizing a particular "mask" option during the fabrication of the device that guarantees nodes within the device are coupled to one logic state. Configuration information can also be placed into the device by altering active device properties, such as the threshold voltages of selected transistors by an ion implantation, or other fabrication step. The assembly step of a semiconductor device can be used to configure a device by a "bonding option", in which selected bond pads of the device are coupled to a selected power supply pin by bond wires. A common, flexible method of storing user configurability information includes utilizing fuse structures. Fuse structures can include fusible links that are opened either electrically by the application of a relatively large current to the fusible link, or by the application of a laser, which vaporizes a portion of the fusible link. Yet another type of "fuse" is an electronic fuse, which utilizes programmable nonvolatile memory structures, such as floating-gate avalanche injected MOS (FAMOS) devices, or other such structures. Programmable nonvolatile memory structures can be more advantageous because the contents stored within such structures can be altered, allowing a user to custom configure a semiconductor device.

A problem associated with semiconductor devices that utilize configurable information is ensuring that the configuration information is properly provided to the device during power-up. The storage structures providing the configuration information may be sensitive to the power supply levels on power-up, and result in incorrect configuration information being provided to the device. If incorrect configuration is generated on power-up, the device will be not function as desired. As just one example, configuration information can be stored in nonvolatile memory cells, and upon power-up, be coupled to volatile memory cells, such as static or dynamic memory cells. Storing configuration information in volatile memory cells can be advantageous, as such cells can be read at faster speeds and/or require lower operating power. In the event the nonvolatile memory cells are coupled to the volatile memory cells prematurely (i.e., before the nonvolatile memory cells are providing stable data), the volatile memory cells may latch/store an incorrect value. The device will be incorrectly configured after power-up.

It would be desirable to provide a semiconductor device that ensures that proper configuration information is provided to the internal circuits during power-up.

SUMMARY OF THE INVENTION

According to the present invention, a semiconductor device includes configuration information that is stored in a number of nonvolatile storage devices, referred to herein as "fuse bits." The configuration information from the fuse bits is supplied to the semiconductor device by the application of an initial power-on reset signal (POR) pulse. This data is then latched into configuration registers for rapid access by the semiconductor device at later times. To ensure that accurate configuration information is provided to the configuration registers, the data stored within the fuse bits is not coupled to the configuration registers until a predetermined delay after the POR signal has been applied. The delay allows the fuse bits to "settle" before their data is latched, ensuring accurate configuration information is stored within the configuration registers.

According to one aspect of the invention, at least a portion of the predetermined delay is generated by a "mock" fuse bit circuit that emulates the settling time of the fuse bits storing the configuration information.

According to another aspect of the invention, a configuration power-on reset (CPOR) pulse generating circuit is provided for generating a pulse to latch the fuse bit data. Provided power is supplied to the semiconductor device, the CPOR circuit will not generate subsequent CPOR pulse, even in the event a subsequent POR pulse is generated. Reset operations occurring when the semiconductor device comes out of a "deep" power down mode will not affect the configuration data.

An advantage of the present invention is that it provides a method of latching configuration data that is not affected by temperature, process, or voltage variations.

Other advantages of the present invention will become apparent in light of the following description thereof.

DETAILED DESCRIPTION OF THE EMBODIMENTS

Figure 1:
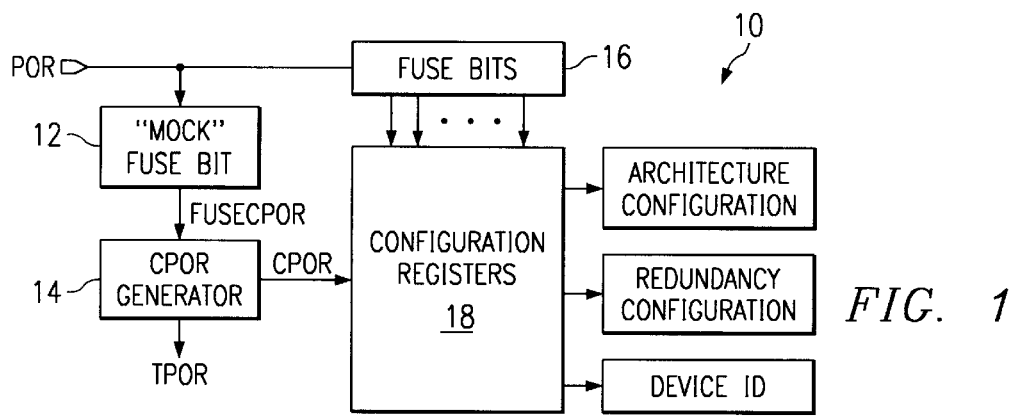
FIG. 1 is a block diagram illustrating a configuration power-on reset circuit according to the present invention.

The present invention will be described in terms of a preferred embodiment and an alternate embodiment. FIG. 1 illustrates a simple block diagram that demonstrates the elements of a preferred embodiment. The operation of this embodiment is described with reference to the timing diagram of FIG. 2. Specific embodiment circuits are then described with reference to FIGS. 3 and 6. An alternate embodiment is set forth in a simple block diagram in FIG. 7.

Referring now to FIG. 1, a configuration power-on reset (CPOR) circuit according to a preferred embodiment is set forth generally, in a block diagram. In the particular embodiment set forth, the CPOR circuit is formed as part of a semiconductor integrated circuit, a nonvolatile semiconductor memory device, for example. The CPOR circuit is designated by the general reference character 10 and shown to include a "mock" fuse bit 12, a CPOR signal generator 14, a number of fuse bits 16, and a number configuration registers 18. Fuse bits 16 form a data store that holds configuration data. Configuration registers 18 form another data store for latching the data held in the fuse bits 16. As the semiconductor integrated circuit is powered up, a power-on reset (POR) signal is generated by a POR signal generator (not shown). The POR signal propagates through the CPOR circuit 10 to eventually latch configuration data from the fuse bits 16 into the configuration registers 18.

The POR signal is coupled directly to the fuse bits 16 and the mock fuse bit 18. The mock fuse bit 18 generates a fuse configuration power-on reset signal (FUSECPOR) that is coupled to the CPOR generator 14. The CPOR generator 14 generates a CPOR signal and a test power-on reset (TPOR) signal. The CPOR signal is coupled to the configuration registers 18, and, when active, latches data therein. The TPOR signal indicates that the CPOR (and POR) signal has fired, and can be used, as just one example, as one indicator of a successful power-up operation.

Figure 2:
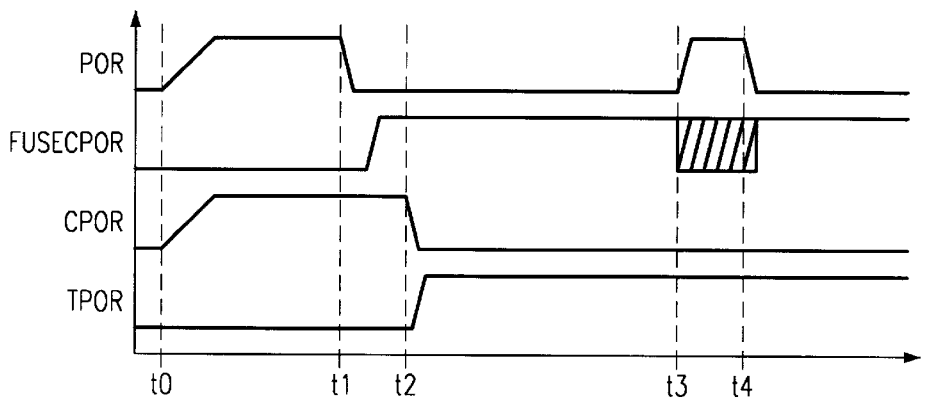
FIG. 2 is a timing diagram illustrating the response of selected signals of the power-on reset circuit set forth in FIG. 1.

Referring now to FIG. 1 in conjunction with FIG. 2, when a power supply voltage is initially applied to the semiconductor device, a power-on reset circuit (not shown) generates an initial POR pulse (shown as the portion of signal POR between time $t_0$ and $t_1$). The initial pulse generates configuration data by stabilizing the fuse bits 16. In the preferred embodiment, the fuse bits 16 include floating gate avalanche injected MOS (FAMOS) devices, and so require some time to "settle" before the configuration data is accurate. At the same time the initial POR pulse is applied to the fuse bits 16, the POR pulse is also applied to mock fuse bit 12, which simulates the response of the fuse bits 16 to the POR pulse. The resulting output is the FUSECPOR signal. In the preferred embodiment, the mock fuse bit 12 is fabricated in the same fashion as the fuse bits 16, and so provides an equivalent response to fuse bits 16 when the POR signal is applied. In this manner, the FUSECPOR signal can track the fuse bit 16 response over variations in process, device temperature, and device supply voltage. This tracking response of the mock fuse bit 12 helps to guarantee that the configuration information of the fuse bits 16 is stable by the time the FUSECPOR signal is generated.

Figure 3:
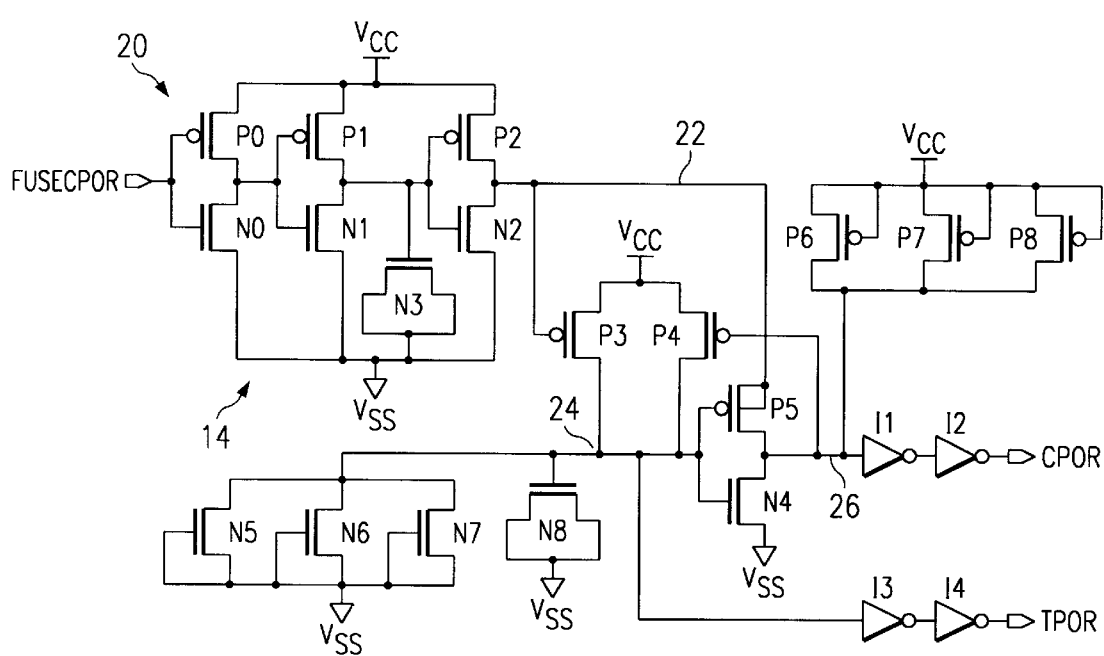
FIG. 3 is schematic diagram illustrating a configuration power-on reset signal generator according to a preferred embodiment.

Referring once again to FIGS. 1 and 2, the CPOR generator 14 receives the FUSECPOR signal and generates the CPOR and TPOR signals set forth in FIG. 2. The CPOR signal generally follows the levels of the POR signal, but has a falling edge that is delayed with respect to POR (i.e., subsequent in time to the falling edge of POR). In the preferred embodiment, the delay between the CPOR and POR signals (shown as the difference between $t_1$ and $t_2$ in FIG. 2) is introduced not only by the mock fuse bit 12, but also by delay circuits within the CPOR generator 14. The CPOR generator 14 also generates the TPOR signal. Unlike the CPOR signal, the TPOR signal remains at the same logic state throughout the CPOR and POR pulses, making a logic transition at the end of the POR pulse. The TPOR pulse thus provides an indication that the CPOR pulse and POR pulse have been fired. The CPOR pulse is coupled to the configuration registers 16 which latch the data provided by the fuse bits 16 in response to the CPOR pulse. Also set forth in FIG. 2 is a second POR pulse shown between times $t_3$ and $t_4$. The second POR represents a POR pulse that is fired subsequent to the initial power-up of the device (i.e., not in response to the power-up of the device). In the preferred embodiment, such a pulse is generated when the device comes out of a "deep" power down mode, and selected portions of the device must be reset. It is noted that once the CPOR pulse has fired in response to the initial POR pulse, subsequent POR pulses will not generate subsequent CPOR pulses. Thus, in the preferred embodiment, once an initial CPOR pulse has been generated, a second CPOR signal will be generated only by turning off the power supply voltages and then powering-up the device a second time. Referring now to FIG. 3, a schematic diagram is set forth illustrating a CPOR generator 14 according to a preferred embodiment. The CPOR generator 14 receives the FUSECPOR signal which simulates the "settling" of fuse bits 16, and in response, generates the data latching signal CPOR, and the successful power-up indicating signal TPOR. The CPOR generator 14 of a preferred embodiment includes a delay circuit 20 having an input that receives the FUSECPOR signal and provides a delayed FUSECPOR signal at delay unit output node 22. The delay circuit 20 includes a first inverter formed by p-channel MOS transistor P0 and n-channel MOS transistor N0, a second inverter formed by p-channel MOS transistor P1 and n-channel MOS transistor N1, and a third inverter formed by p-channel MOS transistor P2 and n-channel MOS transistor N2. The first, second, and third inverters are connected in series. In addition, a third n-channel transistor N3 is connected in a capacitor fashion between Vss and the node formed by the common connection of the drains of P1 and N1 and the gates of P2 and N2. In the preferred embodiment, transistors P0 and P2 have width/length (WIL) sizes of 8/0.9 microns ($\mu$m). Transistors N0 and N2 have W/L sizes of 3/12 $\mu$m. Transistor P1 has a W/L sizing of 3/6 $\mu$m. Transistor N1 has a W/L sizing of 4/0.9 $\mu$m. Transistor N3 has a W/L size of 40/20 $\mu$m. The relative sizing of the p-channel and n-channel device pairs making up the inverters of the delay circuit 20 shift the point at which the inverters trigger, providing increased protection from glitches that could otherwise propagate through the delay circuit 20 and generate an erroneous response.

The output node 22 of the delay circuit 20 is coupled to the gate of pull-up p-channel MOS transistor P3. P3 has a source coupled to Vcc and a drain coupled to a first node 24. The output node 22 of the delay circuit 20 is also coupled to a latching structure formed by p-channel MOS transistors P4 and P5, and n-channel MOS transistor N4. In particular, P5 has its source coupled to the output of the delay circuit 20, its drain coupled to a second node 26 and its gate commonly coupled to the gate N4. N4 has its source coupled to Vss and its drain coupled to the second node 26. P4 is a feedback transistor having its source coupled to Vcc, its drain coupled to the first node 24 and its gate coupled to the second node 26. In the preferred embodiment, the W/L sizing of the transistors is as follows: P3 and P4 are 5/10 $\mu$m; P5 is 10/0.9 $\mu$m; and N4 is of 5/0.9 $\mu$m. Referring still to FIG. 3, CPOR generator 14 of a preferred embodiment further includes three n-channel MOS transistors, N5–N7 connected in parallel between first node 24 and Vss. The gates of all three transistor N5–N6 are coupled to Vss. Also coupled between the first node 24 and Vss is n-channel MOS transistor N8, arranged in a capacitor fashion, having a gate coupled to the first node 24 and a source and drain coupled to Vss. In a similar configuration to that of N5–N7, three p-channel MOS transistors P6–P8 are coupled between the second node 26 and Vcc. The drains of transistors P6–P8 are coupled to the second node 26, while the sources and gates of transistors P6–P8 are coupled to Vcc. In the preferred embodiment, the W/L sizing of transistors N5–N8 and P6–P8 is as follows: N5–N7 have W/L sizes of 10/0.9 $\mu$m; N8 has W/L sizing of 40/20 $\mu$m; and P6–P8 have W/L sizes of 10/0.9. While the preferred embodiments sets forth transistor trios N5–N7 and P6–P8, alternate embodiments could include more or less transistors having a similar configuration.

The preferred embodiment configuration of P3–P5 and N4 provides logic states at the first node 24 and the second node 24. These logic states are buffered to provide strong signals to the remainder of the CPOR circuit 14. The first node 24 is coupled to the input of CMOS inverter I3, and the output of I3 is coupled to the input of CMOS inverter I4. Similarly, the second node 26 is coupled to the input of CMOS inverter I1, the output of which is coupled to the input of CMOS inverter I2. The outputs of I2 and I4 provide the CPOR and TPOR signals, respectively. The relative W/L ratios between the p-channel MOS devices and n-channel MOS devices in the preferred embodiment is as follows: I1 10/5, I2 30/15, I3 6/3, and I4 10/5.

Referring now to FIG. 3 in conjunction with FIG. 4, the operation of the CPOR generator 14 of FIG. 2 will be described. Initially, as Vcc ramps up during power-up, FUSECPOR remains low. With FUSECPOR low as Vcc rises, P0 will begin to turn on, turning on N1, which allows P2 to turn on. In this manner the voltage at the output node 22 of the delay circuit 20 (the common drain connection of P2 and N2) will begin to ramp up with Vcc at time $t_0'$. During the initial ramping of Vcc, the first node 24 is maintained at approximately Vss. Voltage levels less than Vss are prevented by transistors N5–N7 which will not allow the first node 24 to drop more than one n-channel threshold voltage (Vt) below Vss, due to signal or substrate coupling, or other effects such as subthreshold leakage, or the like. Thus, transistors N5–N7 can be conceptualized as clamping the first node 24 around Vss. Initial voltage levels at the first node 24 above Vss are prevented by P3 which will not allow the node to rise more than one p-channel Vt above Vss (because Vcc is equal to Vss initially). The capacitor connected transistor N8 further helps maintain the first node 24 at Vss as the power supply ramps up.

In a similar manner to N5–N7, P6–P8 prevent subthreshold leakage from allowing the second node 26 from rising above Vcc by more than one p-channel Vt. P6–P8 can be conceptualized as clamping the second node 26 around Vcc. With first node 24 low, the gate of transistor P5 will remain around Vss as the source of P5 ramps up with Vcc, and P5 will begin to ramp up the second node 26 with Vcc, via its drain. In this manner, P5 can be conceptualized as powering-up the second node 26. The rising signal at the second node 26 on power-up is buffered by inverters I1 and I2 to generate the initial rising edge of the CPOR pulse. The voltage at first node 24 is buffered by inverters I3 and I4 to generate TPOR (which remains around Vss).

Once POR has reached full Vcc, FUSECPOR will remain low and the output of delay circuit 20 will remain high and P3 will remain off. With the second node 26 high, feedback transistor P4 remains off. CPOR and TPOR continue to track the first node 24 and second node 26, respectively, with CPOR staying high, and TPOR staying low.

Figure 4:
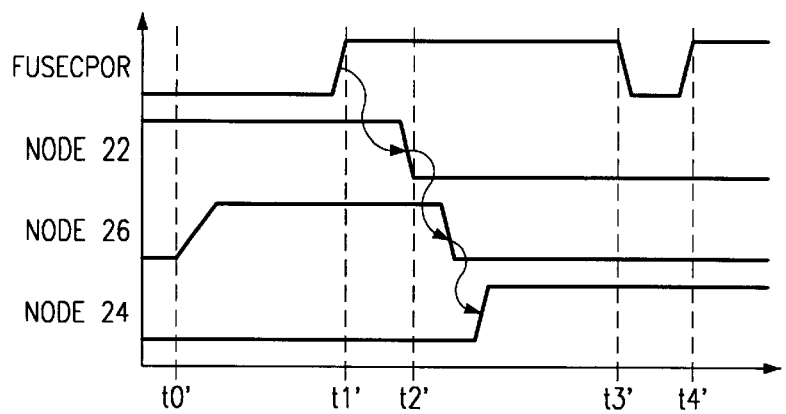
FIG. 4 is a timing diagram illustrating the state of selected nodes of the power-on reset signal generator during the operation of a preferred embodiment.

As set forth in FIG. 4, in response to the initial POR pulse falling, FUSECPOR goes high at time $t_1'$. As FUSECPOR goes high, P0 is turned off and N0 is turned on. P1 is turned on and N1 is turned off, and N3 begins to charge, turning on N2 and turning off P2. In this manner delay circuit 20 provides a falling output signal at node 22 at given delay after the falling edge of the initial POR pulse. The delay is set forth in FIG. 4 as the difference between times $t_1$ and $t_2$. In a preferred embodiment the delay is in the general range of 25 nanoseconds.

With the output node 22 of delay circuit 20 low, the low potential is coupled through the source-drain path of P5 to the second node 26 which begins to drop in potential. Once the second node 26 is more than one p-channel Vt below Vcc, feedback transistor P4 begins to turn on. Capacitor connected transistor N8 charges, and the first node 24 begins to rise to Vcc. As the voltage at the first node 24 rises, N4 is turned on, clamping the second node 26 to Vss. The low output voltage at node 22 also turns on P3, which also couples the first node 24 to Vcc. The high-to-low transition of second node 26 is buffered by operation of inverters I1 and I2 to generate the falling edge of signal CPOR. Similarly, the low-to-high transition at the first node 24 is buffered by inverters I3 and I4 to generate the rising edge of TPOR. As CPOR falls to Vss, the latching of data from the fuse bits 16 into the configuration registers 18 is complete. The mock fuse bit 12 and delay introduced by delay circuit 20 ensure that sufficient time has been allocated for the fuse bit data to be stabilized and properly latched by the time the latching operation is complete (CPOR falls to Vss).

Referring once again to FIG. 4, a second FUSECPOR pulse, subsequent to the initial power-on pulse is shown occurring at time $t_3'$ and terminating at time $t_4'$. The second pulse represents the response of the FUSECPOR signal to a subsequent POR pulse generated after power-on, to reset circuits that were disabled during a power-down mode. Referring back to FIG. 3, it is shown that subsequent FUSECPOR pulses will not have an effect on second node 26 (i.e., CPOR) or first node 24 (i.e., TPOR) provided power has been maintained to the device. Once node 24 has been pulled high, capacitor connected transistor N8 will be charged. The charging of N8 in combination with the latching effect of feedback transistor P4, maintains the first node 24 at Vcc despite the fact that FUSECPOR may go low in response to the second POR pulse. If FUSECPOR goes low, the output node 22 of delay circuit 20 will go high. With node 22 high, a high voltage will be applied to the drain of P5, and P3 will be turned off. Despite the high voltage at its source, P5 will remain off because first node 24 will remain charged high by P4. In addition, with first node 24 high, N4 will remain on, keeping second node 26 low so that P4 maintains its latching action, pulling the first node 24 to Vcc. Thus, subsequent POR transitions do not substantially alter the voltages at the first node 24 or second node 26, and CPOR and TPOR maintain low and high states, respectively.

Figure 5:
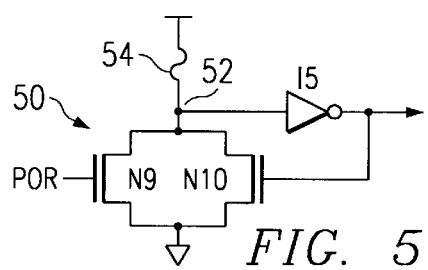
FIG. 5 is a schematic diagram illustrating a fuse bit structure according to one embodiment.

Referring now to FIG. 5, a schematic diagram is set forth illustrating one fuse bit 50 according to one embodiment of the present invention. The fuse bit 50 includes two transistors (N9 and N10) arranged in parallel, having their sources commonly coupled to one power supply voltage and their drains commonly coupled to a sense node 52. A fusible link 54 is coupled between the sense node 52 and a second power supply voltage. An inverter I5, has an input coupled to the sense node 52 and an output that feeds back to the gate of transistor N10. The gate of transistor N9 receives the POR signal. In the particular embodiment set forth in FIG. 5, the transistors are n-channel MOS transistors, the first power supply voltage is Vss and the second power supply voltage is Vcc.

Having described the general components of fuse bit 50, the operation of the fuse bit will be described. The fuse bit 50 will provide a high (~Vcc) or low (~Vss) logic level depending upon whether fusible link 54 is intact or opened. In the event fusible link 54 is intact, as the Vcc rises to full value, sense node 52 will be pulled to Vcc by fusible link 54. As the initial POR pulse rises to Vcc, transistor N9 will turn on, but will not be able to pull down sense node 52, and the sense node 52 will remain at about Vcc. Inverter I5 will drive the gate of N10 low, and N10 will remain off. In this manner, the fuse bit 50 will provide a high logic value at sense node 52 (and consequently a low logic value at the output of I5) in response to the POR pulse. Either of these values can then be latched into configuration registers by the CPOR pulse.

In the event fusible link 54 is opened, either electrically or by the application of a laser, the sense node 52 will not rise to Vcc on power-up. Further, as POR goes high, transistor N9 will be turned on, and sense node 52 will be coupled to Vss. With sense node 52 at a logic low value, inverter I5 will drive the gate of N10 high, and N10 will turn on, also pulling sense node 52 low. In this manner, the fuse bit 50 will provide a low logic value at sense node 52 (and consequently a high logic value at the output of I5) in response to the POR pulse. Either of these values can then be latched into configuration registers by the CPOR pulse. N10 can be advantageous in the event the initial operation used to open fusible link 54 is only partially successful, resulting in highly resistive, but partially intact fusible link 54. In such a case, when transistor N9 is turned on as POR goes high, it will sink more current than the fusible link 54 can source, and sense node 52 will go low. N10 will turn on as described, and sink additional current such that the fusible link will be fused open.

Figure 6:
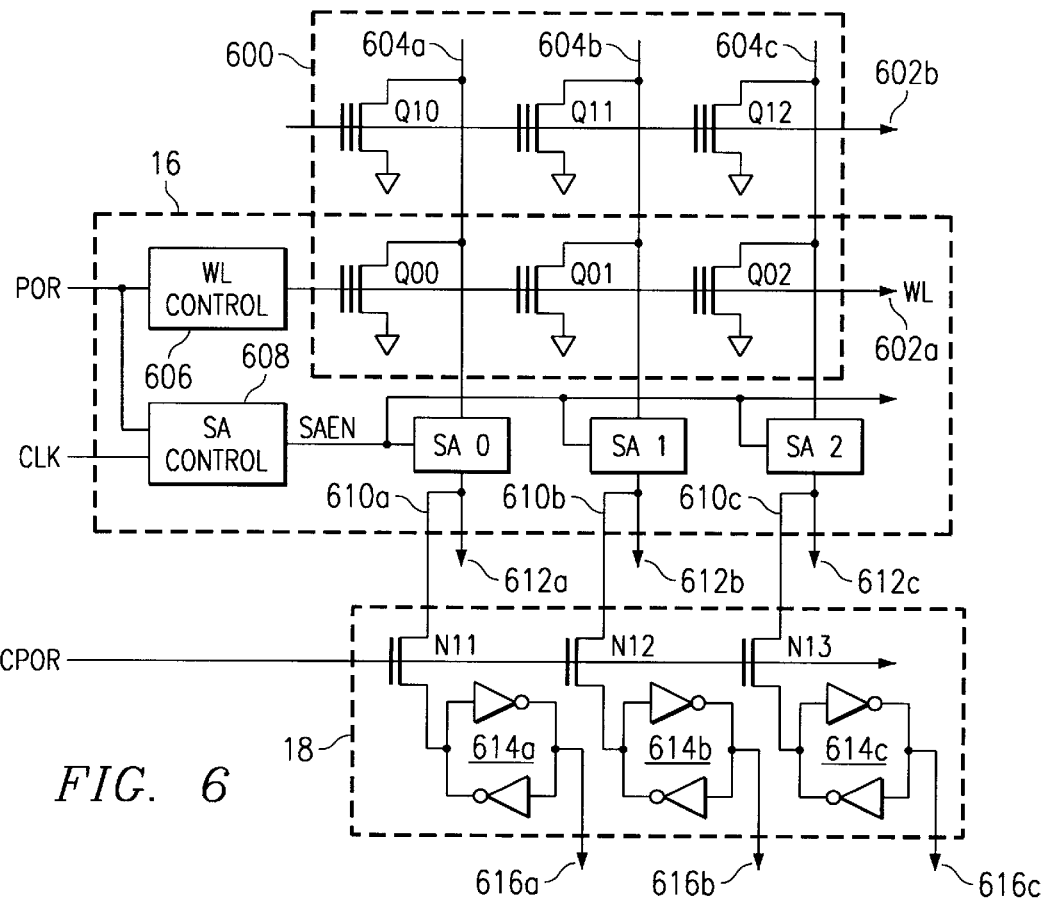
FIG. 6 is a schematic diagram illustrating a fuse bit structure according to a second embodiment.

Referring now to FIG. 6, a schematic diagram is set forth to illustrate fuse bits 16 that employ nonvolatile storage devices, and one embodiment of the configuration registers 18. In the embodiment set forth in FIG. 6, the invention is utilized in a electrically erasable and programmable read only memory (EEPROM). The EEPROM set forth includes an array 600 of single transistor EEPROM memory cells arranged in two rows and three columns. Each row of memory cells has a common word line 602a and 602b and each column has a common bit line 604a and 604c. Six memory cells of the array are set forth as $Q_{00}$–$Q_{02}$ and $Q_{10}$–$Q_{12}$. It is understood that the array can include many more such memory cells. As is shown in FIG. 6, a portion of the array 600 (cells $Q_{00}$–$Q_{02}$) are used to form fuse bits 16. In the particular embodiment set forth, the remainder of the array 600 is used to store data for standard EEPROM operations.

The fuse bits 16 of the embodiment set forth in FIG. 6 are shown to include EEPROM storage cells $Q_{00}$–$Q_{02}$, a sense amplifier corresponding to each bit line (show as $SA_0$–$SA_2$), a word line controller 606, and a sense amplifier controller 608. Detection of the data stored in the fuse bits 16 is accomplished in a similar fashion to a standard EEPROM read operation.

In response to the falling edge of POR, the word line controller 606 drives word line 602a to a high voltage. In response to word line 602a going high, the sense amplifiers $SA_0$–$SA_1$ generate a high or low output signal, depending upon whether their respective storage cells have been programmed to a high threshold or not.

For example, in the event the configuration data "010" is to be stored in the fuse bits, cells $Q_{00}$ and $Q_{02}$ will be programmed (and so will have a high threshold voltages) and cell $Q_{01}$ will be erased (and so have a low or "normal" threshold voltage). When the word line goes high, due to its lower threshold voltage, cell $Q_{01}$ will provide a low impedance path to Vss. In contrast, cells $Q_{00}$ and $Q_{02}$ will not provide a low impedance path to Vss as the word line voltage will be insufficient to turn on the cells. The sense amplifier controller 608 will enable the sense amplifiers $SA_0$ to $SA_2$, with the SAEN signal. Because cell $Q_{01}$ provides a low impedance path to Vss, bit line 604a will be pulled low and sense amplifiers $SA_1$ will drive its respective output 606b high. In contrast, because no low impedance path to Vss has been provided by cells $Q_{00}$ and $Q_{02}$ sense amplifiers $SA_0$ and $SA_2$ will drive their respective outputs (610a and 610c) to a low logic level. In this manner, the data values 0, 1, and 0 are presented and outputs 610a, 610b and 610c, respectively, in response to the POR signal.

It is noted that the sense amplifier controller 608 and sense amplifiers SA$_0$–SA$_2$ can be used in conventional EEPROM operations, such as reading data from cells Q$_{10}$ and Q$_{12}$. In such an operation the CLK signal (as opposed to the POR signal) would be used to generate SAEN, and the data would be placed on conventional input/output paths shown as 612a–612c. Just one example of the a clock signal could be a pulse generated in response to an address transition received in address input pins of the EEPROM. Further, one or more levels of column decoding could be situated between the bit lines (604a–604c) and their respective sense amplifiers (SA$_0$–SA$_2$).

Referring again to FIG. 6, the configuration registers 16 of one embodiment are shown to include passgate transistors N11–N13 and latches 614a–614c. The latches 614a–614c are formed by cross-coupled inverters, and provide latch outputs 616a–616c. In operation, once the sense amplifiers SA$_0$–SA$_2$ have sensed the data (driven their outputs either high or low in response to SAEN) the data can be considered "settled," and CPOR goes high, coupling the outputs 610a–610c to latches 614a–614c respectively. In this manner, the data stored in cells Q$_{00}$ and Q$_{02}$ is now stored in latches 614a–614c, and can be rapidly read by other circuits of the EEPROM.

While two particular fuse bit embodiments have been set forth in detail, it is understood that configuration storage or configuration setting structures other than fusible links or EEPROM cells could be utilized. Such alternate fuse bits could include, without limitation, a mask option, a bonding option, "antifuse" structures, different types of nonvolatile memory cells including ferroelectric devices, or conventional MOS transistors having threshold voltages altered in fabrication steps, to name just a few. It follows that the fuse bits could include combinations of different storage or configuration setting structures.

It is also noted that in fuse bit configurations such as that set forth in FIG. 6, the mock fuse bit 12 could be one or more columns of the array. For example, memory cell Q$_{00}$, bit line 604a, and sense amp SA$_0$ could be used to generate FUSECPOR.

In the event different stored configuration values could result in different settling times, the mock fuse bit 12 could include two different storage devices or configuration setting structures intentionally set to opposite logic states. The resulting opposing logical outputs could be logically combined in an exclusive-OR manner to ensure that the FUSECPOR would include the worst delay case.

Figure 7:
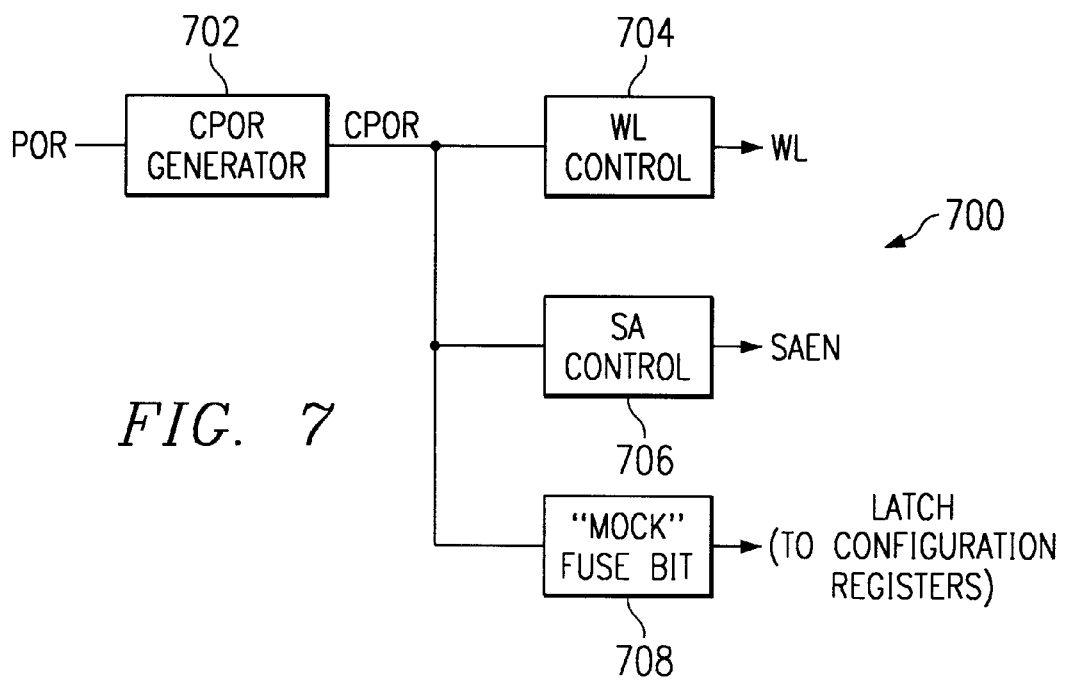
FIG. 7 is block diagram illustrating a configuration power-on reset circuit according to an alternate embodiment.

Referring now to FIG. 7, an alternate embodiment is set forth in block diagram form. The alternate embodiment is designated by the general reference character 700, and includes a CPOR generator 702, a word line controller 704, a sense amplifier controller 706, and a mock fuse bit 708. The CPOR generator 702 and mock fuse bit 708 operate in the same fashion as the CPOR generator 14 and mock fuse bit 12 described with reference to FIG. 1. The alternate embodiment can be used in memory devices or logic devices (such as programmable logic devices or programmable logic arrays) having word lines or equivalent structures, when it is not desirable to drive the word line in response to subsequent configuration pulses.

Figure 8:
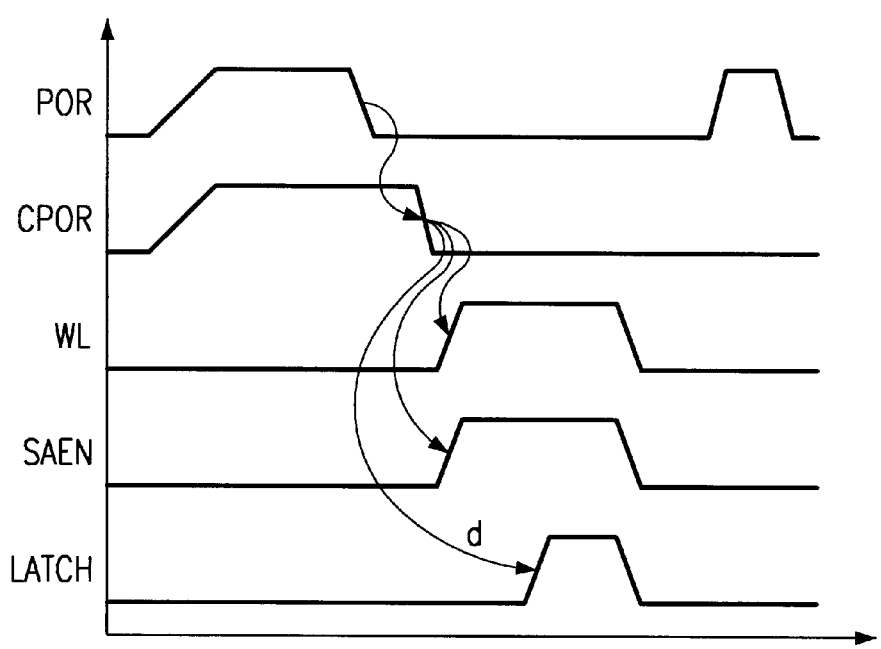
FIG. 8 is a timing diagram illustrating the operation of the alternate embodiment set forth in FIG. 7.

The operation of the alternate embodiment is best described with reference to FIG. 7 in conjunction with FIG. 8. Upon power-up POR has an initial high going pulse. CPOR generator 702 will generate a CPOR signal which generally follows, but is delayed with respect to POR. On the falling edge of CPOR, the word line (WL) used to read the configuration information is driven high by word line controller 704. The SAEN signal follows, drive by sense amp controller 706. The mock fuse bit 708 introduces a delay which ensures the configuration information is settled, before going high, to latch the configuration data in the configuration registers.

The present invention is applicable to various other semiconductor devices in which it is desirable to have configuration information that is accurately stored upon power-up. Just a few such devices include, without limitation, memory devices other than nonvolatile memory devices, such as dynamic RAMs (DRAMs), static RAMs (SRAMs), as well as programmable logic devices, programmable logic arrays, programmable gate arrays, microprocessors, and digital signal processing integrated circuits.

Accordingly, although the present invention has been described in detail, it should be understood that various changes, substitutions, and alterations can be made without departing from the spirit and scope of the invention as defined by the appended claims.

What is claimed is:

1. In a semiconductor device having a first power supply voltage, a circuit for generating stabilized configuration upon power-up, comprising:

a first data store for storing configuration information, the first data store receiving a power-on reset signal and providing the configuration information as data;

a mock fuse bit for receiving for receiving the power-on resist signal, tracking response of the first data store, and generating a fuse configuration reset signal;

a configuration signal generator for receiving the fuse configuration reset signal and generating a configuration reset signal in response thereto, the configuration reset signal being delayed with respect to the power-on reset signal, the configuration signal generator includes a charge device coupled between a node and a predetermined voltage for maintaining the node at the predetermined voltage as the first power supply voltage increases in magnitude during power-up; and a second data store for receiving the configuration reset signal from the configuration signal generator and storing the data from the first data store.

2. The circuit of claim 1, wherein:

the first data store includes a plurality of non-volatile storage elements.

3. The circuit of claim 1, wherein:

the configuration reset signal generated by the configuration signal generator is delayed with respect to the powering up of the semiconductor device by a delay sufficient to allow the data from the first data store to become stable.

4. The circuit of claim 1, wherein:

the power-on reset signal and the configuration reset signal are pulses.

5. In a semiconductor device having a first power supply voltage, a circuit for generating stabilized configuration upon power-up, comprising:

a first data store for storing configuration information, the first data store receiving a power-on reset signal and providing the configuration information as data;

a mock fuse bit for receiving the power-on reset signal, tracking response of the first data store, and generating a fuse configuration reset signal;

a configuration signal generator for receiving the fuse configuration signal and generating a configuration reset signal in response thereto, the configuration reset signal being delayed with respect to the power-on reset signal, the configuration signal generator includes a clamping device for preventing a node from substantially varying from a predetermined voltage as the first power supply voltage increases in magnitude during power-up; and a second data store for receiving the configuration reset signal from the configuration signal generator and storing the data from the first data store.

6. The circuit of claim 5 wherein the power-on reset signal and the configuration reset signal are pulses.

7. In a semiconductor device having a first power supply voltage, a circuit for generating stabilized configuration upon power-up, comprising:

a first data store for storing configuration information, the first data store receiving a power-on reset signal and providing the configuration information as data;

a mock fuse bit for receiving the power-on reset signal, tracking response of the first data store, and generating a fuse configuration reset signal;

a configuration signal generator for receiving the fuse configuration reset signal and generating a configuration reset signal in response thereto, the configuration reset signal being delayed with respect to the power-on reset signal, the configuration signal generator includes a power-up device for enabling a node to approach a predetermined potential as the first power supply voltage approaches its maximum value; and a second data store for receiving the configuration reset signal from the configuration signal generator and storing the data from the first data store.

8. The circuit of claim 7 wherein the power-on reset signal and the configuration reset signal are pulses.

* * * * *